United States Patent [19]

Motoki et al.

[11] Patent Number: 4,637,146
[45] Date of Patent: Jan. 20, 1987

[54] SPIN DRYER

[75] Inventors: Yasunari Motoki, Yokohama; Yuji Ohkuma, Kawasaki, both of Japan

[73] Assignee: Fujitsu Limited, Kawasaki, Japan

[21] Appl. No.: 640,643

[22] Filed: Aug. 14, 1984

[30] Foreign Application Priority Data

Sep. 19, 1983 [JP] Japan ................. 58-173546

[51] Int. Cl.[4] ................................ F26B 11/18
[52] U.S. Cl. ................................ 34/58; 34/8
[58] Field of Search ................. 34/8, 36, 58

[56] References Cited

U.S. PATENT DOCUMENTS

| 949,930 | 2/1910 | Hutchins | 34/58 |
| 3,740,866 | 6/1973 | Williams | 34/58 |
| 4,027,686 | 6/1977 | Shortes et al. | 134/33 |
| 4,257,637 | 3/1981 | Hassan et al. | 294/64 |
| 4,313,266 | 2/1982 | Tam | 34/58 |
| 4,350,562 | 9/1982 | Bonu | 156/639 |
| 4,445,281 | 5/1984 | Aigoo | 34/58 |

FOREIGN PATENT DOCUMENTS

| 0089454 | 1/1983 | European Pat. Off. | |
| 2929739 | 2/1981 | Fed. Rep. of Germany | |
| 3148957 | 6/1983 | Fed. Rep. of Germany | |
| 7629492 | 9/1976 | France | |
| 128737 | 8/1983 | Japan | 34/58 |

OTHER PUBLICATIONS

K. Schade, "Halbleiter Technologie", vol. 1, 1st edition, 2/1981, VEB Verlag Technik, Berlin, p. 84.
European Search Report.
IBM Technical Disclosure Bulletin, vol. 22, No. 11, Apr. 1980, NY.
IBM Technical Disclosure Bulletin, vol. 17, No. 1, Jun. 1974, NY.

*Primary Examiner*—Albert J. Makay
*Assistant Examiner*—David W. Westphal
*Attorney, Agent, or Firm*—Armstrong, Nikaido, Marmelstein & Kubovcik

[57] ABSTRACT

A spin dryer including a rotary stage for supporting a substrate to be dried, particularly adapted for use in producing semiconductor devices, and a stationary cover spaced from the substrate. The stationary cover has at least the same area as that of the substrate and is provided with a number of openings for charging a dry and dust-free gas onto the substrate, whereby oxidation and dust-contamination of the substrate are avoided.

6 Claims, 9 Drawing Figures

SPIN DRYER

BACKGROUND OF THE INVENTION

1. Field of the Invention

The present invention relates to a spin dryer, more particularly a spin dryer for drying substrates adapted for producing semiconductor devices.

2. Description of the Prior Art

In semiconductor device production processes, particularly wafer processes and also photomask processes, a substrate is treated by a succession of reagent solutions. After each treatment, the substrate has to be washed with pure water or alcohol and then dried. For drying, the substrate is mounted on a spin dryer and subjected to high speed rotation, e.g., 3000 to 5000 rpm, by means of an electric motor. The resultant centrifugal force quickly drives the washing liquid off the substrate. This quick drying is necessary in order to avoid oxidation or dust contamination of the substrate.

In the prior art spin dryers, however, the upper surface of the substrate is still left exposed to the ambient atmosphere. Thus, during rotation, even if only of a short time period, the substrate is contacted by the atmosphere and minute dust deposits thereon, contaminating the substrate and reducing the quality of the resultant semiconductor devices.

SUMMARY OF THE INVENTION

It is a primary object of the present invention to provide a spin dryer for drying a substrate without oxidation.

It is another object of the present invention to provide a spin dryer for drying a substrate without dust contamination.

Other objects and advantages of the present invention will be clear from the following description.

According to the present invention, there is provided a spin dryer including a rotary stage for supporting a substrate to be dried, wherein a stationary cover having at least the same area as the substrate is provided at a space from the substrate. The stationary cover has a number of openings in its inner surface facing the substrate to be dried for charging a drying gas onto the substrate.

BRIEF DESCRIPTION OF THE DRAWINGS

The present invention will become clearer from the ensuing description of preferred embodiments made in reference to the appended drawings, in which.

DESCRIPTION OF THE PREFERRED EMBODIMENTS

Figure 1:
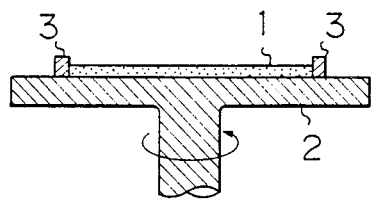
FIG. 1 is a sectional view of a prior art spin dryer.

FIG. 1 is a sectional view of a prior art spin dryer. As evident from the figure, a semiconductor wafer 1 is fixed on the surface of a rotary stage 2 by stoppers 3. However, the upper surface of the water is left exposed to the ambient atmosphere.

Figure 2:
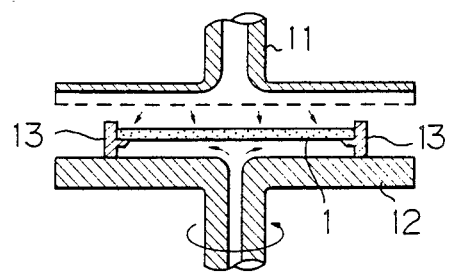
FIG. 2 is a sectional view of an embodiment of a spin dryer according to the present invention.

FIG. 2 is a schematic view of an embodiment of a spin rotary dryer according to the present invention. The wafer 1 is supported on four stoppers 13 at a space 1 to 2 mm above a rotary stage 12. As evident from the drawing, each of the stoppers 13 have protrusions upon which the wafer 1 rests. A stationary cover 11 is provided at a space 5 to 10 mm above the water 1 and has at least the same area as the wafer 1. A drying gas, e.g., dry and dust-free nitrogen is charged onto the surface of the wafer 1 from the stationary cover 11 through a number of openings provided in its inner surface and through an opening in the shaft of the rotary stage 12. The stationary cover 11 is supplied with the drying gas through its central shaft. The rotary stage is driven at a speed of 5,000 rpm by an electric motor.

Figure 3A:
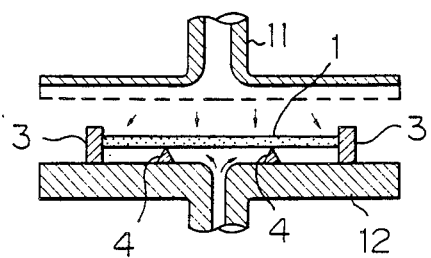
FIG. 3(a) is a sectional view of another embodiment of a spin dryer according to the present invention.
Figure 3B:
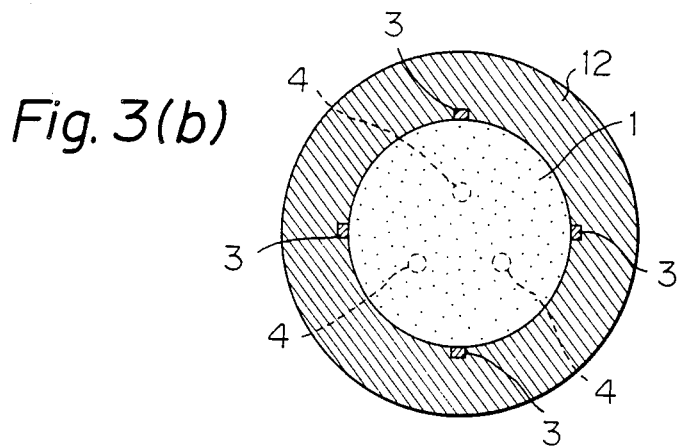
FIG. 3(b) is a plan view of the rotary stage of the dryer shown in FIG. 3(a)

FIG. 3(a) is a sectional view of another embodiment of a spin dryer according to the present invention. FIG. 3(b) is a plan view of the rotary stage of the dryer. This embodiment is identical to that of FIG. 2, except the wafer 1 is laterally fixed at its periphery by four stoppers 3 and rests on three vertical protrusions 4 provided on the stage 12, i.e., the stoppers 3 are not provided with lateral protrusions.

Figure 4A:
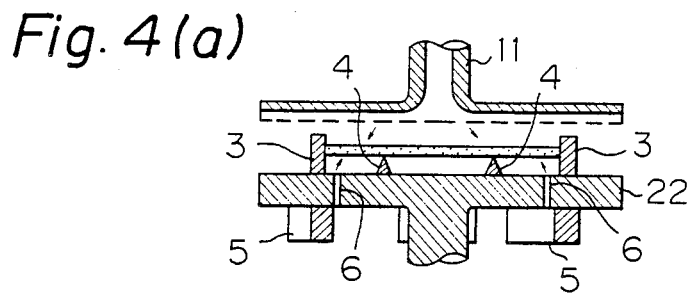
FIG. 4(a) is a sectional view of still another embodiment of a spin dryer according to the present invention.
Figure 4B:
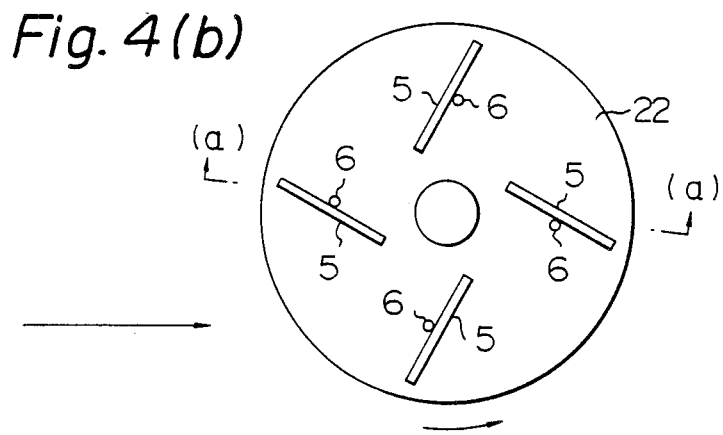
FIG. 4(b) is a bottom view of the rotary stage of the dryer shown in FIG. 4(a)

FIG. 4(a) is a sectional view of still another embodiment of a spin dryer according to the present invention. FIG. 4(b) is a bottom view of the rotary stage of the dryer. In this embodiment, the rotary stage is driven by means of the drying gas itself rather than an electric motor.

Referring to FIGS. 4(a) and (b), a rotary stage 22 is provided with four vanes 5 on its bottom surface, i.e., the surface not facing the wafer 1. The vanes deviate in direction from the radial direction of the rotary stage 22. Close to each vane 5 in the rotary stage 22 is provided an opening 6. As in the previous embodiments, the drying gas is blown onto the wafer 1 through a number of openings provided in the inner surface of the stationary cover 11. Unlike the previous embodiments, however, the drying gas is not blown through an opening in the shaft of the rotary stage 22. The corresponding portion of the drying gas is blown against the bottom surface of the rotary stage 22 so as to strike the vanes 5 and drive the rotary stage 22. It reaches the back surface of the wafer 1 through the openings 6.

With this embodiment, it is therefore possible to dispense with an electric motor drive. In this case, however, the drying gas must be blown in a dry and dust-free case which encloses at least the rotary stage.

Figure 5A:
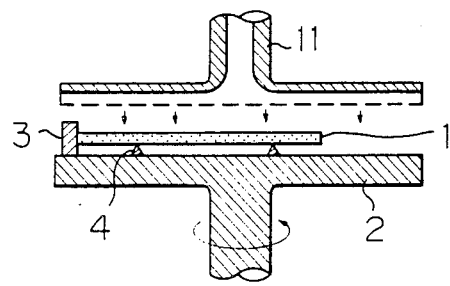
FIG. 5(a) is a sectional view of yet another embodiment of a spin dryer according to the present invention.
Figure 5B:
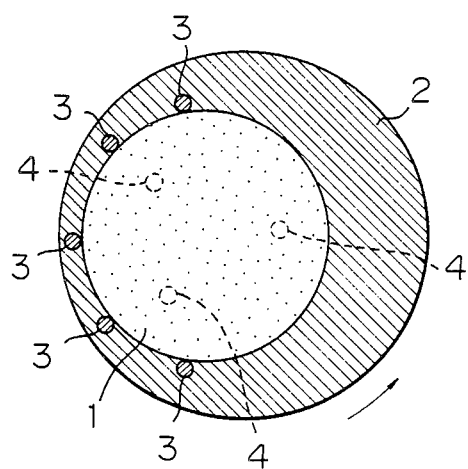
FIG. 5(b) is a plan view of the rotary stage of the dryer shown in FIG. 5(a)

FIG. 5(a) is a sectional view of yet another embodiment of a spin dryer according to the present invention. FIG. 5(b) is a plan view of the rotary stage of the dryer. As in the previous embodiments, the drying gas is blown onto the wafer 1 through a number of openings provided in the inner surface of the stationary cover 11. Unlike the previous embodiments, however, the drying gas is not blown on the bottom of the rotary stage 2. As opposed to the previous embodiments, where the wafer was positioned coaxial with the rotary stage, the characteristic feature of this embodiment is that the wafer 1 is positioned eccentric to the rotary stage 2, being laterally fixed along less than half of the periphery close to the edge of the rotary stage 2 by five stoppers 3 and resting on three vertical protrusions 4 on the rotary stage 2.

Figure 5C:
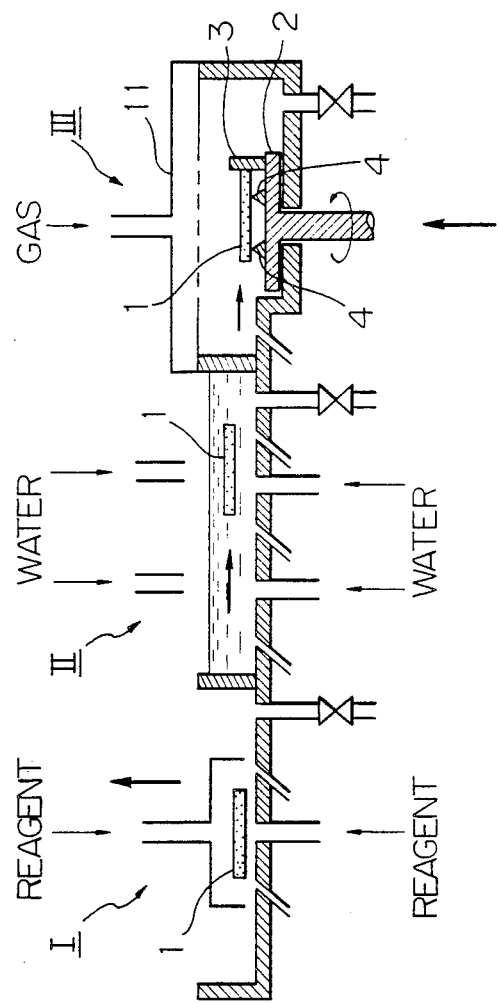
FIG. 5(c) is a view of the in-line system, in which the substrate is conveyed by means of water jets onto the dryer shown in FIG. 5(a).

Such a spin dryer is particularly suited for use in an in-line wafer treatment system, as schematically shown in FIG. 5(c). FIG. 5(c) is a view of the in-line system, in which the wafer 1 is conveyed by means of water jets from a treatment stage I, to a washing stage II, and then to a drying stage III. In such a system, the wafer 1 is automatically moved from step to step without exposure to the ambient atmosphere. The advantage of the characteristic feature of this embodiment is that the wafer 1 can be easily emplaced by the water jets against the stoppers 3 and onto the vertical protrusions 4. After the wafer 1 is properly emplaced, the water is drained from the drying chamber and the rotary stage 2 is moved upward to appropriately space the wafer 1 from the stationary cover 11.

While the present invention has been explained with reference to preferred embodiments thereof, it is not limited to the same. Various modifications are possible by those skilled in the art. For example, the wafer may rest directly on the surface of the rotary stage.

We claim:

1. A spin dryer comprising a rotary stage for supporting a substrate to be dried, characterized in that said stage is provided with stopper means at the periphery of said substrate and periphery of said stage for supporting said substrate above the surface of said stage with the center of said substrate located eccentric with the shaft of said rotary stage, said substrate being fixed by said stoppers as said rotary stage rotates and a stationary cover is provided at a space from said substrate, said stationary cover having at least the same area as that of said substrate, a number of openings being provided in the inner surface of said stationary cover facing said substrate and means for charging a drying gas through said cover and said cover openings onto said substrate for drying said substrate.

2. A spin dryer according to claim 1, characterized in that said substrate is supported by means of protrusions provided on said stage and fixed by means of stoppers at the periphery of said substrate.

3. A spin dryer according to claim 1, characterized in that an opening is provided at the center of said rotary stage and communicates with a through hole at the center of a shaft of said rotary stage.

4. A spin dryer according to claim 1, characterized in that said substrate is a substrate adapted for use in producing semiconductor devices.

5. A spin dryer according to claim 1, characterized in that said substrate is a photomask adapted for use in producing semiconductor devices.

6. A spin dryer according to claim 1, characterized in that said drying gas is nitrogen containing substantially no dust and no moisture.

* * * * *